United States Patent
Nakano

(10) Patent No.: US 7,990,172 B2
(45) Date of Patent: Aug. 2, 2011

(54) METHOD AND APPARATUS FOR TESTING ELECTRONIC DEVICE

(75) Inventor: Rikizo Nakano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/556,241

(22) Filed: Sep. 9, 2009

(65) Prior Publication Data

US 2009/0322344 A1    Dec. 31, 2009

Related U.S. Application Data

(63) Continuation of application No. PCT/JP2007/061109, filed on May 31, 2007.

(51) Int. Cl.
*G01R 31/34* (2006.01)
(52) U.S. Cl. .................................. 324/762.01
(58) Field of Classification Search ............... 324/158.1, 324/110, 575, 750–768; 438/14–18; 327/534
See application file for complete search history.

(56) References Cited

U.S. PATENT DOCUMENTS

| | | |
|---|---|---|
| 6,404,219 B1 | 6/2002 | Yamamoto |
| 6,914,419 B2 * | 7/2005 | Katayama ................ 323/225 |

FOREIGN PATENT DOCUMENTS

| | | |
|---|---|---|
| JP | 63-063979 A | 3/1988 |
| JP | 06-118128 A | 4/1994 |
| JP | 07-174816 A | 7/1995 |
| JP | 2000-174081 A | 6/2000 |
| JP | 2004-226220 A | 8/2004 |

OTHER PUBLICATIONS

International Search Report of PCT/JP2007/061109, date of mailing Sep. 4, 2007.

* cited by examiner

*Primary Examiner* — Huy Phan
*Assistant Examiner* — Trung Q Nguyen
(74) *Attorney, Agent, or Firm* — Westerman, Hattori, Daniels & Adrian, LLP

(57) ABSTRACT

An electronic device test method incorporating a stress application step that is effective in screening out infant mortality failures of an electronic device. More specifically, a method for testing an electronic device constructed from a single or a plurality of semiconductor components, includes: turning a power supply on and off repeatedly while changing the ON/OFF cycle and/or voltage value of the power supply that is connected to the electronic device; and verifying whether or not the electronic device operates normally after the power supply has been turned on and off repeatedly.

16 Claims, 4 Drawing Sheets

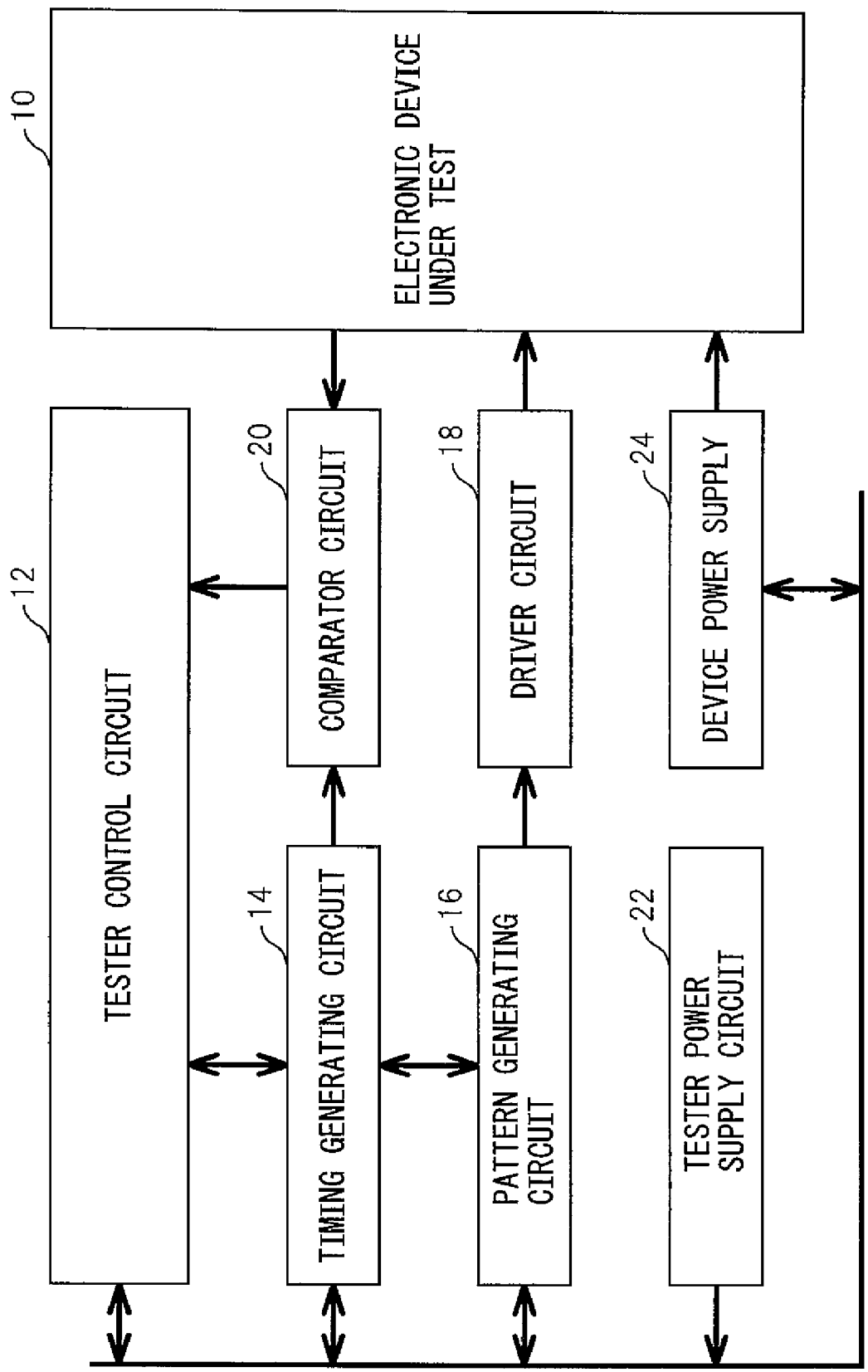

METHOD AND APPARATUS FOR TESTING ELECTRONIC DEVICE

CROSS-REFERENCE TO RELATED APPLICATIONS

This application is a continuation of PCT/JP2007/061109, filed on May 31, 2007, the entire contents of which are incorporated herein by reference.

FIELD

The present invention relates to a method and apparatus for testing an electronic device exemplified by a single semiconductor component, such as a memory device, or by a device constructed by mounting a plurality of semiconductor components.

BACKGROUND

In recent years, with advances in process miniaturization, the number of failure modes that can occur in semiconductor memories, etc., has been increasing. There are some defectives that cannot be completely eliminated by a high-temperature burn-in test or the like alone.

If pattern-dependent defectives detectable only by a long-duration running test are to be detected, it will take a prohibitively long test time because of increased integration. There is therefore a need for effective test conditions that do not depend on operation patterns.

Patent document 1 cited below as a prior art document relevant to the present invention discloses a test apparatus equipped with a means for setting the rise and fall times of the supply voltage to be applied to a semiconductor integrated circuit to arbitrarily selected values, thereby making it possible to accurately detect manufacturing defects attributable to the rise and fall times of the supply voltage.

On the other hand, patent document 2 cited below discloses an accelerated life test method for a semiconductor integrated circuit in which the test is performed by applying a bias voltage to the semiconductor integrated circuit under heat and, between supply voltage and signal voltage, at least the supply voltage is periodically reset to a low level where a latch-up current is shut off.

Patent document 3 cited below discloses a stress application amount control method that controls the amount and timing of stress application to each circuit block as desired; more specifically, a power supply switch is provided for each circuit block, and the power supply switch is individually controlled during a burn-in test to adjust the power supply time, i.e., the amount of stress, for each individual circuit block, thereby making it possible to apply a necessary and sufficient amount of stress to the circuit block that requires the longest stress application time, while preventing application of excessive stress to the other circuit blocks.

Patent document 1: Japanese Unexamined Patent Publication No. H06-118128
Patent document 2: Japanese Unexamined Patent Publication No. H07-174816
Patent document 3: Japanese Unexamined Patent Publication No. 2004-226220

SUMMARY

The present invention has been made in view of the above situation, and an object of the invention is to provide an electronic device test method and apparatus by incorporating a stress application step that is effective in screening out infant mortality failures of electronic devices.

To achieve the above object, according to the present invention, there is provided a method for testing an electronic device constructed from a single or a plurality of semiconductor components, comprising the steps of: turning a power supply on and off repeatedly while randomly changing the ON/OFF cycle and/or voltage value of the power supply that is connected to the electronic device; and verifying whether or not the electronic device operates normally after the power supply has been turned on and off repeatedly.

In one preferred mode, the step of turning the power supply on and off repeatedly is performed by randomly changing power supply OFF time while holding the voltage value constant at a rated voltage and also holding power supply ON time constant at a predefined time.

In one preferred mode, the step of turning the power supply on and off repeatedly is performed by randomly changing power supply ON time while holding the voltage value constant at a rated voltage and also holding power supply OFF time constant at a predefined time.

In one preferred mode, the step of turning the power supply on and off repeatedly is performed by randomly changing the voltage value while holding power supply ON time and power supply OFF time constant at a predefined time.

In one preferred mode, the step of turning the power supply on and off repeatedly is performed by randomly changing power supply ON time and/or power supply OFF time while also randomly changing the voltage value.

In one preferred mode, the step of turning the power supply on and off repeatedly is carried out in combination with a temperature burn-in test step.

According to the present invention, there are also provided an apparatus for implementing the above method and a computer program for causing the apparatus to function.

As the power supply is turned on and off, the voltage being applied to the electronic device changes transiently, but by randomly changing the ON/OFF cycle or the voltage value, various voltage rise patterns and voltage fall patterns are applied to the electronic device, and the self-heating cycle changes. That is, the electronic device is subjected to a test similar to a temperature cycle test. As a result, in a situation where it is difficult to perform each individual pattern for failure extraction, the test method of the present invention provides an effective alternative means. Since the power supply ON/OFF step is not one that guarantees operation, a highly efficient stress can be applied within a range that does not destroy the electronic device, and thus the step is effective in screening out infant mortality failures.

BRIEF DESCRIPTION OF THE DRAWINGS

FIG. 1 is a block diagram depicting one example of a test apparatus for implementing an electronic device test method according to the present invention.

DESCRIPTION OF THE REFERENCE NUMERALS

Figure 2A:
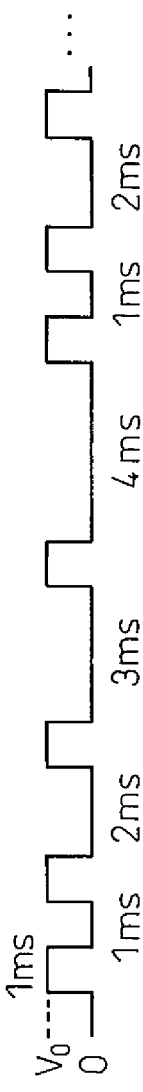
FIGS. 2A, 2B, 2C, and 2D are time charts illustrating supply voltage ON/OFF patterns generated by varying power supply OFF time or power supply ON time.

10. ELECTRONIC DEVICE UNDER TEST
12. TESTER CONTROL CIRCUIT

14. TIMING GENERATING CIRCUIT
16. PATTERN GENERATING CIRCUIT
18. DRIVER CIRCUIT
20. COMPARATOR CIRCUIT
22. TESTER POWER SUPPLY CIRCUIT
24. DEVICE POWER SUPPLY

DESCRIPTION OF EMBODIMENTS

An embodiment of the present invention will be described below with reference to the accompanying drawings. FIG. 1 is a block diagram depicting one example of a test apparatus for implementing an electronic device test method according to the present invention. In FIG. 1, an electronic device under test 10 may be a single semiconductor component such as a semiconductor memory device, or a package such as a memory module containing a plurality of semiconductor components, or a consumer device such as a personal computer.

A tester control circuit 12 is a computer system comprising a processor, main memory, etc. With the processor operating according to a program loaded into the main memory, the computer system controls the entire operation of the test apparatus and thereby achieves an electronic device test function.

A timing generating circuit 14 generates various timing clock signals necessary for the operation of the test apparatus. A pattern generating circuit 16 is a circuit that generates an input signal pattern for testing the electronic device 10 and an expected output signal pattern. A driver circuit 18 is a circuit that applies the input signal pattern to the electronic device 10 in accordance with a prescribed specification.

A comparator circuit 20 is a circuit that compares the output signal pattern of the electronic device 10 with an expected value. A tester power supply circuit 22 is a circuit that supplies power necessary for driving the test apparatus. A device power supply 24 is a power supply for supplying a voltage to be applied to the electronic device 10.

In the test according to the present invention, before verifying the operation through monitoring of the output signal pattern generated in response to the input signal pattern, a stress application step is performed by turning the device power supply 24 on and off repeatedly while randomly changing the ON/OFF cycle and/or voltage value of the device power supply 24, thereby facilitating the extraction of infant mortality failures. A description will be given below of how the stress is applied using the supply voltage.

FIG. 2 is a set of time charts illustrating supply voltage ON/OFF patterns generated by varying the power supply OFF time or power supply ON time. More specifically, in the supply voltage ON/OFF pattern depicted in FIG. 2A, the supply voltage value is held constant at the rated voltage $V_0$, and the power supply ON time is also held constant at 1 ms, but the power supply OFF time is changed from 1 ms to 2 ms to 3 ms and then to 4 ms, and this sequence is repeated a predetermined number of times or for a predetermined period of time.

Figure 2B:
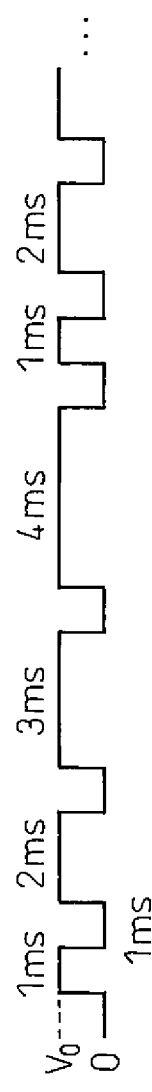

On the other hand, in the supply voltage ON/OFF pattern depicted in FIG. 2B, the supply voltage value is held constant at the rated voltage $V_0$, and the power supply OFF time is also held constant at 1 ms, but the power supply ON time is changed from 1 ms to 2 ms to 3 ms and then to 4 ms, and this sequence is repeated a predetermined number of times or for a predetermined period of time.

Figure 2C:
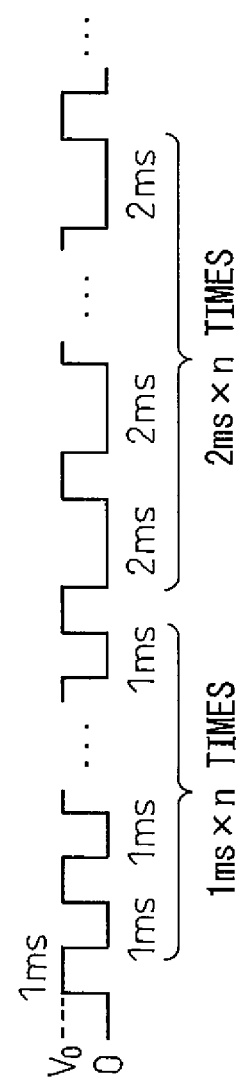

The supply voltage ON/OFF pattern depicted in FIG. 2C is a modification of the supply voltage ON/OFF pattern depicted in FIG. 2A, the difference being that the cycle of the same power supply OFF time is repeated a plurality of times in such a manner that the cycle of 1-ms OFF time is repeated n times, the cycle of 2-ms OFF time is repeated n times, and so on.

Figure 2D:
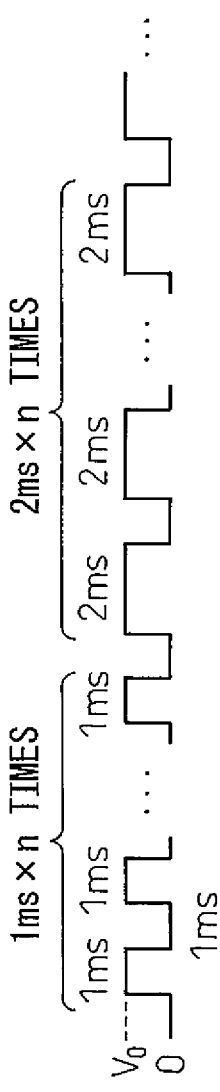

Likewise, the supply voltage ON/OFF pattern depicted in FIG. 2D is a modification of the supply voltage ON/OFF pattern depicted in FIG. 2B, the difference being that the cycle of the same power supply ON time is repeated a plurality of times in such a manner that the cycle of 1-ms ON time is repeated n times, the cycle of 2-ms ON time is repeated n times, and so on.

Figure 3:
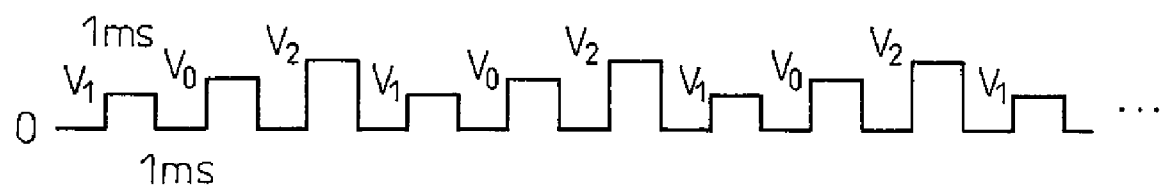
FIG. 3 is a time chart illustrating a supply voltage ON/OFF pattern generated by varying voltage value.

FIG. 3 is a time chart illustrating a supply voltage ON/OFF pattern generated by varying the voltage value. More specifically, the power supply OFF time and the power supply ON time are both held constant at 1 ms, but the voltage value is changed from $V_1$, which is lower than the rated voltage, to the rated voltage $V_0$, and then to $V_2$, which is higher than the rated voltage, and this sequence is repeated a predetermined number of times or for a predetermined period of time.

Figures 4A, 4B:
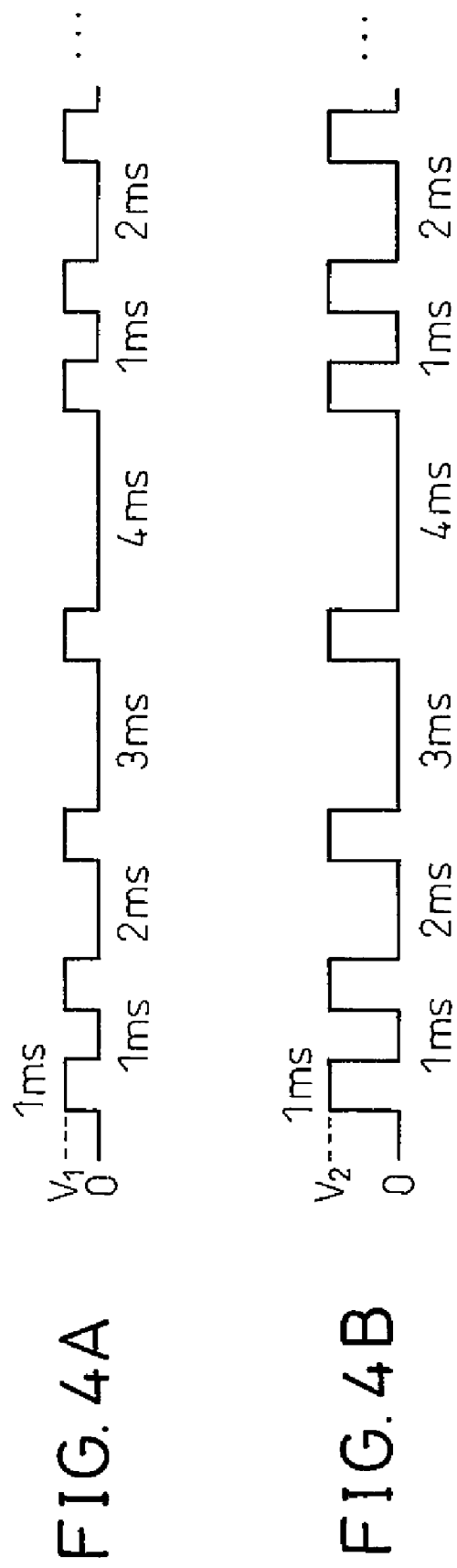
FIGS. 4A and 4B are time charts illustrating supply voltage ON/OFF patterns generated by varying the power supply OFF time and by changing the voltage value.

FIG. 4 is a set of time charts illustrating supply voltage ON/OFF patterns generated by varying the power supply OFF time and by changing the voltage value. More specifically, in the supply voltage ON/OFF pattern depicted in FIG. 4A, the power supply ON time is held constant at 1 ms, but the voltage value is changed to $V_1$ which is lower than the rated voltage; in this condition, the power supply OFF time is changed from 1 ms to 2 ms to 3 ms and then to 4 ms, and this sequence is repeated a predetermined number of times or for a predetermined period of time.

On the other hand, in the supply voltage ON/OFF pattern depicted in FIG. 4B, the power supply ON time is held constant at 1 ms, but the voltage value is changed to $V_2$ which is higher than the rated voltage; in this condition, the power supply OFF time is changed from 1 ms to 2 ms to 3 ms and then to 4 ms, and this sequence is repeated a predetermined number of times or for a predetermined period of time.

Here, the pattern of FIG. 4A may be combined with the pattern of FIG. 4B, and it is also possible to suitably combine the various patterns depicted in FIGS. 2 and 3. By performing the operation verification through monitoring of the output signal pattern generated in response to the input signal pattern after the stress has been applied using the supply voltage as described above, infant mortality failures of the electronic device 10 can be easily extracted at an early stage.

Further, the step of turning the power supply on and off repeatedly may be carried out in combination with a temperature burn-in test step.

What is claimed is:

1. A method for testing an electronic device constructed from a single or a plurality of semiconductor components, comprising:

turning a power supply on and off repeatedly while randomly changing an ON/OFF cycle and/or voltage value of said power supply that is connected to said electronic device to apply an electrical stress onto the electronic device; and monitoring a signal pattern output from the electronic device generated in response to a signal pattern input to the electronic device, after applying an electrical stress onto the electronic device, to verify whether or not said electronic device operates normally after the power supply has been turned on and off repeatedly.

2. A method for testing an electronic device as claimed in claim 1, wherein the turning of said power supply on and off repeatedly is performed by randomly changing power supply OFF time while holding said voltage value constant at a rated voltage and also holding power supply ON time constant at a predefined time.

3. A method for testing an electronic device as claimed in claim 1, wherein the turning of said power supply on and off repeatedly is performed by randomly changing power supply ON time while holding said voltage value constant at a rated voltage and also holding power supply OFF time constant at a predefined time.

4. A method for testing an electronic device as claimed in claim 1, wherein the turning of said power supply on and off repeatedly is performed by randomly changing said voltage value while holding power supply ON time and power supply OFF time constant at a predefined time.

5. A method for testing an electronic device as claimed in claim 1, wherein the turning of said power supply on and off repeatedly is performed by randomly changing power supply ON time and/or power supply OFF time while also randomly changing said voltage value.

6. A method for testing an electronic device as claimed in claim 1, wherein the turning of said power supply on and off repeatedly is carried out in combination with a temperature burn-in test step.

7. An apparatus for testing an electronic device constructed from a single or a plurality of semiconductor components, comprising:
   a unit configured to turn a power supply on and off repeatedly while randomly changing an ON/OFF cycle and/or voltage value of said power supply that is connected to said electronic device to apply an electrical stress onto the electronic device; and
   a unit configured to monitor a signal pattern output from the electronic device generated in response to a signal pattern input to the electronic device, after applying an electrical stress onto the electronic device, to verify whether or not said electronic device operates normally after the power supply has been turned on and off repeatedly.

8. An apparatus for testing an electronic device as claimed in claim 7, wherein the unit configured to turn said power supply on and off repeatedly randomly changes power supply OFF time while holding said voltage value constant at a rated voltage and also holding power supply ON time constant at a predefined time.

9. An apparatus for testing an electronic device as claimed in claim 7, wherein the unit configured to turn said power supply on and off repeatedly randomly changes power supply ON time while holding said voltage value constant at a rated voltage and also holding power supply OFF time constant at a predefined time.

10. An apparatus for testing an electronic device as claimed in claim 7, wherein the unit configured to turn said power supply on and off repeatedly randomly changes said voltage value while holding power supply ON time and power supply OFF time constant at a predefined time.

11. An apparatus for testing an electronic device as claimed in claim 7, wherein the unit configured to turn said power supply on and off repeatedly randomly changes power supply ON time and/or power supply OFF time while also randomly changing said voltage value.

12. For use with an apparatus for testing an electronic device constructed from a single or a plurality of semiconductor components, a non-transitory computer-readable storage medium of a program for causing a computer contained in said apparatus to function as:
   a unit for turning a power supply on and off repeatedly while randomly changing an ON/OFF cycle and/or voltage value of said power supply that is connected to said electronic device to apply an electrical stress onto the electronic device; and
   a unit for a unit for monitoring a signal pattern output from the electronic device generated in response to a signal pattern input to the electronic device, after applying an electrical stress onto the electronic device, to verify whether or not said electronic device operates normally after the power supply has been turned on and off repeatedly.

13. A non-transitory computer-readable storage medium as claimed in claim 12, wherein the unit for turning said power supply on and off repeatedly randomly changes power supply OFF time while holding said voltage value constant at a rated voltage and also holding power supply ON time constant at a predefined time.

14. A non-transitory computer-readable storage medium as claimed in claim 12, wherein the unit for turning said power supply on and off repeatedly randomly changes power supply ON time while holding said voltage value constant at a rated voltage and also holding power supply OFF time constant at a predefined time.

15. A non-transitory computer-readable storage medium as claimed in claim 12, wherein the unit for turning said power supply on and off repeatedly randomly changes said voltage value while holding power supply ON time and power supply OFF time constant at a predefined time.

16. A non-transitory computer-readable storage medium as claimed in claim 12, wherein the unit for turning said power supply on and off repeatedly randomly changes power supply ON time and/or power supply OFF time while also randomly changing said voltage value.

* * * * *